United States Patent
Tsubouchi (10) Patent No.: US 11,723,146 B2
(45) Date of Patent: Aug. 8, 2023

(54) PRINTING WIRING BOARD AND ELECTRONIC DEVICE

(71) Applicant: Kioxia Corporation, Tokyo (JP)

(72) Inventor: Yuta Tsubouchi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/644,434

(22) Filed: Dec. 15, 2021

(65) Prior Publication Data

US 2023/0089773 A1 Mar. 23, 2023

(30) Foreign Application Priority Data

Sep. 21, 2021 (JP) .................. 2021-153441

(51) Int. Cl.
*H05K 1/02* (2006.01)
*H05K 1/09* (2006.01)
*H05K 1/18* (2006.01)

(52) U.S. Cl.
CPC ............. *H05K 1/0296* (2013.01); *H05K 1/09* (2013.01); *H05K 1/181* (2013.01)

(58) Field of Classification Search
CPC ............ H05K 1/02; H05K 1/181; H05K 1/09; H05K 1/0296

USPC ......................................................... 361/760
See application file for complete search history.

(56) References Cited

U.S. PATENT DOCUMENTS

2019/0341664 A1  11/2019  Su

FOREIGN PATENT DOCUMENTS

| CN | 108124375 A | 6/2018 |
| JP | 2018-10673 A | 1/2008 |
| JP | 5392131 B2 | 1/2014 |
| JP | 2020-4904 A | 1/2020 |
| JP | 2020-5018 A | 1/2020 |

*Primary Examiner* — Tremesha S Willis
(74) *Attorney, Agent, or Firm* — Oblon, McClelland, Maier & Neustadt, L.L.P.

(57) ABSTRACT

First and second conductors extend on and along a first surface of a substrate. The first conductor includes first and second parts extending in first and second directions and a third part connected to the first and second parts. The second conductor includes fourth and fifth parts extending in the first and second directions and a sixth part connected to the fourth and fifth parts. A first insulator partly covers the first surface, covers the first to fifth parts, and is partly opened in a first region extending along the sixth part above the sixth part in a third direction.

20 Claims, 7 Drawing Sheets

PRINTING WIRING BOARD AND ELECTRONIC DEVICE

CROSS-REFERENCE TO RELATED APPLICATIONS

This application is based upon and claims the benefit of priority from Japanese Patent Application No. 2021-153441, filed Sep. 21, 2021, the entire contents of which are incorporated herein by reference.

FIELD

Embodiments described herein relate generally to a printed wiring board and an electronic device.

BACKGROUND

An electronic device including a printed wiring board is known. A printed wiring board includes conductive wiring provided on a surface or inner layer of the printed wiring board. Wiring sometimes transmits signals having a relatively high frequency. Such signals are sometimes transmitted in a form of differential signals including a positive signal and a negative signal. On this occasion, wiring for transmitting differential signals is arranged on the printed wiring board.

DETAILED DESCRIPTION

In general, according to one embodiment, a printed wiring board includes: a substrate having an insulative property; a first conductor on the first surface of the substrate; a second conductor on the first surface of the substrate; and a first insulator.

The substrate extends along a first plane, and includes a first surface extending along the first plane. The first conductor extends along the first surface. The second conductor extends at a distance from the first conductor along the first surface. The first insulator covers a part of the first surface of the substrate. The first conductor includes: a first part having a linear shape and extending in a first direction parallel to the first plane; a second part extending in a second direction which is parallel to the first plane and intersects with the first direction; and a third part including a first end and a second end. The first end is connected to the first part. The second end is connected to the second part. The second conductor includes: a fourth part having a linear shape and extending in the first direction; a fifth part having a linear shape and extending in the second direction; and a sixth part including a third end and a fourth end. The third end is connected to the fourth part. The fourth end is connected to the fifth part. The first insulator further covers the first part, the second part, and the third part of the first conductor, and the fourth part and the fifth part of the second conductor, and is opened in a part of a first region extending along the sixth part of the second conductor. The first region is positioned above the sixth part of the second conductor in a third direction intersecting with the first direction and the second direction.

Embodiments will now be described with reference to the figures. In the following description, components with substantially the same functionalities and configurations will be referred to with the same reference symbols. To distinguish between components having approximately the same function and configuration, a symbol including a number or a letter may be attached to the end of the reference symbol of each component. All the descriptions of the components given a reference symbol with no additional symbol attached thereto for distinction are applied to the components given a reference symbol with an additional symbol attached thereto for distinction, unless otherwise expressed.

The figures are schematic, and the relation between the thickness and the area of a plane of a layer and the ratio of thicknesses of layers may differ from those in actuality. The figures may include components which differ in relations and/or ratios of dimensions in different figures.

Hereinafter, embodiments are described using an xyz orthogonal coordinate system. The positive direction in the vertical axis of the figures may be referred to as an "upper side", and the negative direction in the vertical direction of the figures may be referred to as a "lower side". The positive direction in the horizontal axis of the figures may be referred to as a "right side", and the negative direction in the horizontal direction of the figures may be referred to as a "left side". Namely, in a plan view showing an xy plane as viewed in a +z direction (i.e., an xy plan view (the same applies below)), the upper side refers to a +y direction, and the lower side refers to a -y direction. In the xy plan view as viewed in the +z direction, the right side refers to a +x direction, and the left side refers to a -x direction. In an xz plan view as viewed in the -y direction, the upper side refers to the +z direction, and the lower side refers to a -z direction. In the xz plan view as viewed in the -y direction, the right side refers to the +x direction, and the left side refers to the -x direction.

1. First Embodiment

1.1. Structure (Configuration)

1.1.1. Overall Configuration of Electronic Device

Figure 1:
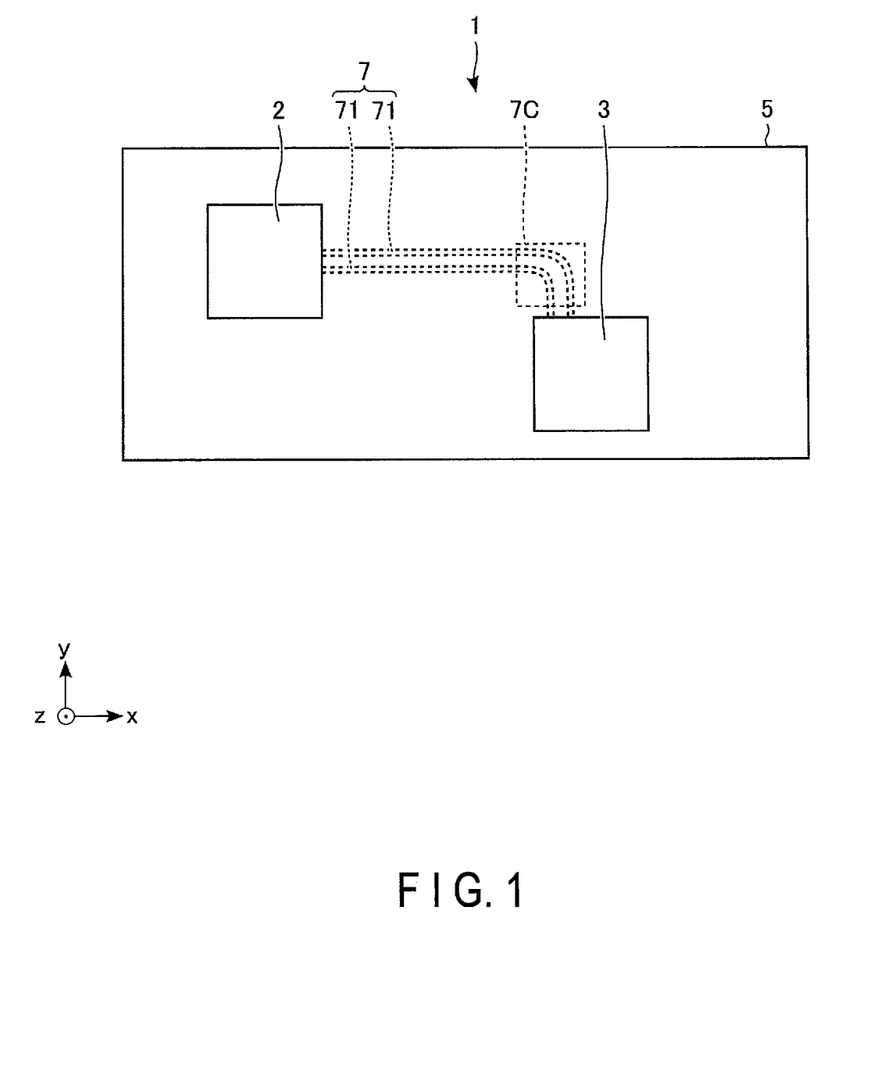
FIG. 1 is a plan view showing an example of a structure of an electronic device according to a first embodiment.

FIG. 1 is a plan view showing an example of a structure of an electronic device according to a first embodiment. FIG. 1 is an xy plan view of an electronic device 1 as viewed in the +z direction.

As shown in FIG. 1, the electronic device 1 includes a device 2, a device 3, and a printed wiring board 5.

The printed wiring board 5 is a substrate on which a plurality of layers of insulators and a plurality of layers including conductors are stacked. The device 2 and the device 3 as electronic components are mounted on the printed wiring board 5. The printed wiring board 5 extends along the xy plane. A surface of the printed wiring board 5 as viewed in the +z direction is referred to as an "upper surface". A direction vertical to the surface of the printed wiring board 5 conforms to the z-axis. The z-axis is a thickness direction of the printed wiring board 5. The printed wiring board 5 includes a conductor group 7 including a plurality of conductors 71. The conductors 71 function as wiring. The conductor group 7 includes a part 7C where a direction in which the conductor group 7 extends changes.

The device 2 is a semiconductor device including a semiconductor die, a package, and a plurality of terminals. The semiconductor die includes, for example, an integrated circuit (IC). The package includes a resin which seals the semiconductor die. Some of the plurality of terminals are electrically coupled to pads of the semiconductor die, to provide an electrical connection between the semiconductor die and conductors outside the device 2. The device 2 is arranged on the upper surface of the printed wiring board 5. The device 2 is electrically coupled to the plurality of conductors 71 by the plurality of terminals.

The device 3 is a semiconductor device including a semiconductor die, a package, and a plurality of terminals. The semiconductor die includes, for example, an IC. The package includes a resin which seals the semiconductor die. Some of the plurality of terminals are electrically coupled to pads of the semiconductor die, to provide an electrical connection between the semiconductor die and conductors outside the device 3. The device 3 is arranged on the upper surface of the printed wiring board 5. The device 3 is electrically coupled to the plurality of conductors 71 by the plurality of terminals. The device 3 is electrically coupled to the device 2 via each conductor 71. The device 3 transmits signals to the device 2 via each conductor 71 and receives signals transmitted from the device 2.

Figure 2:
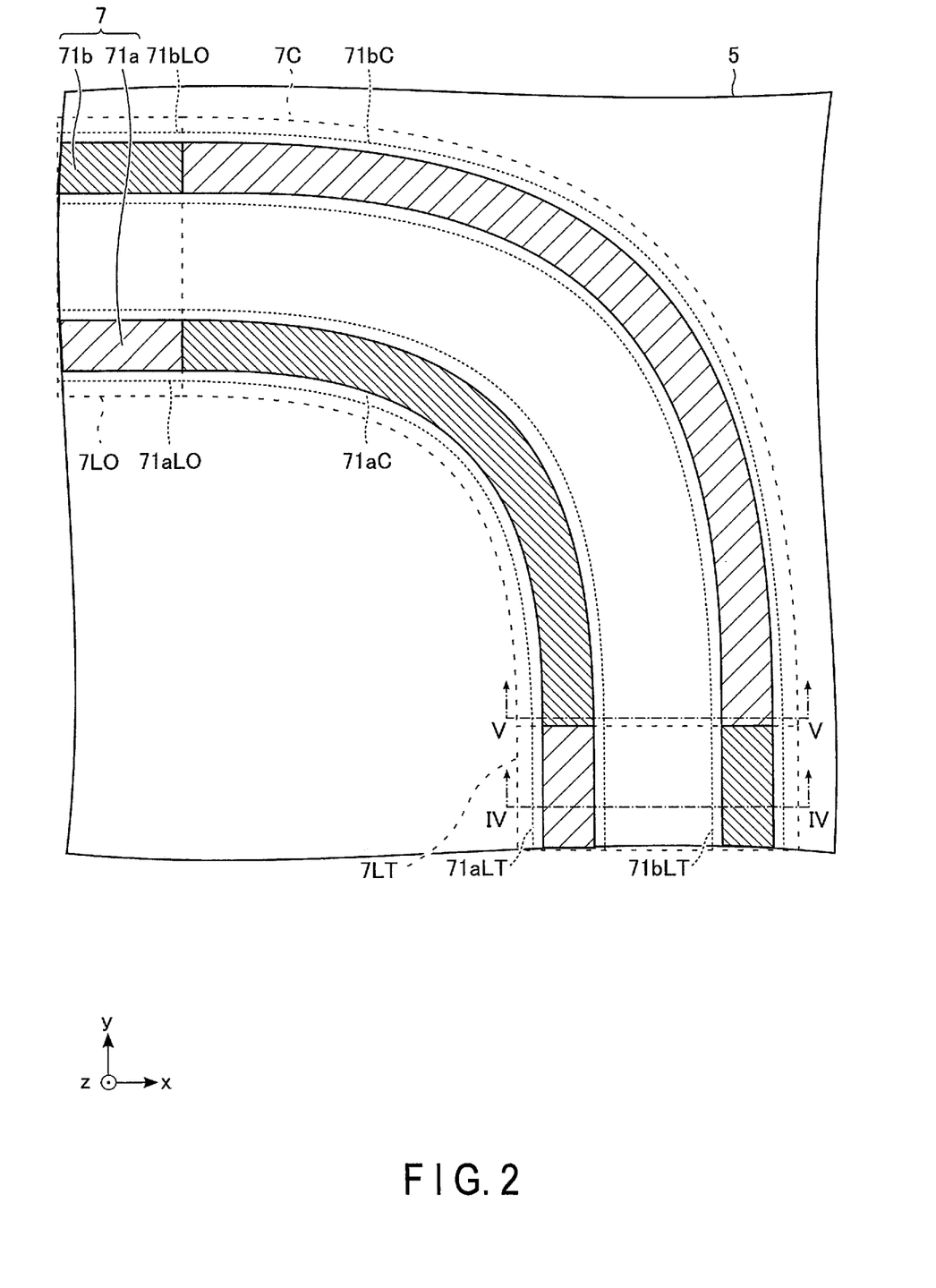
FIG. 2 is a plan view showing a part of an example of a structure of a printed wiring board according to the first embodiment.
Figure 3:
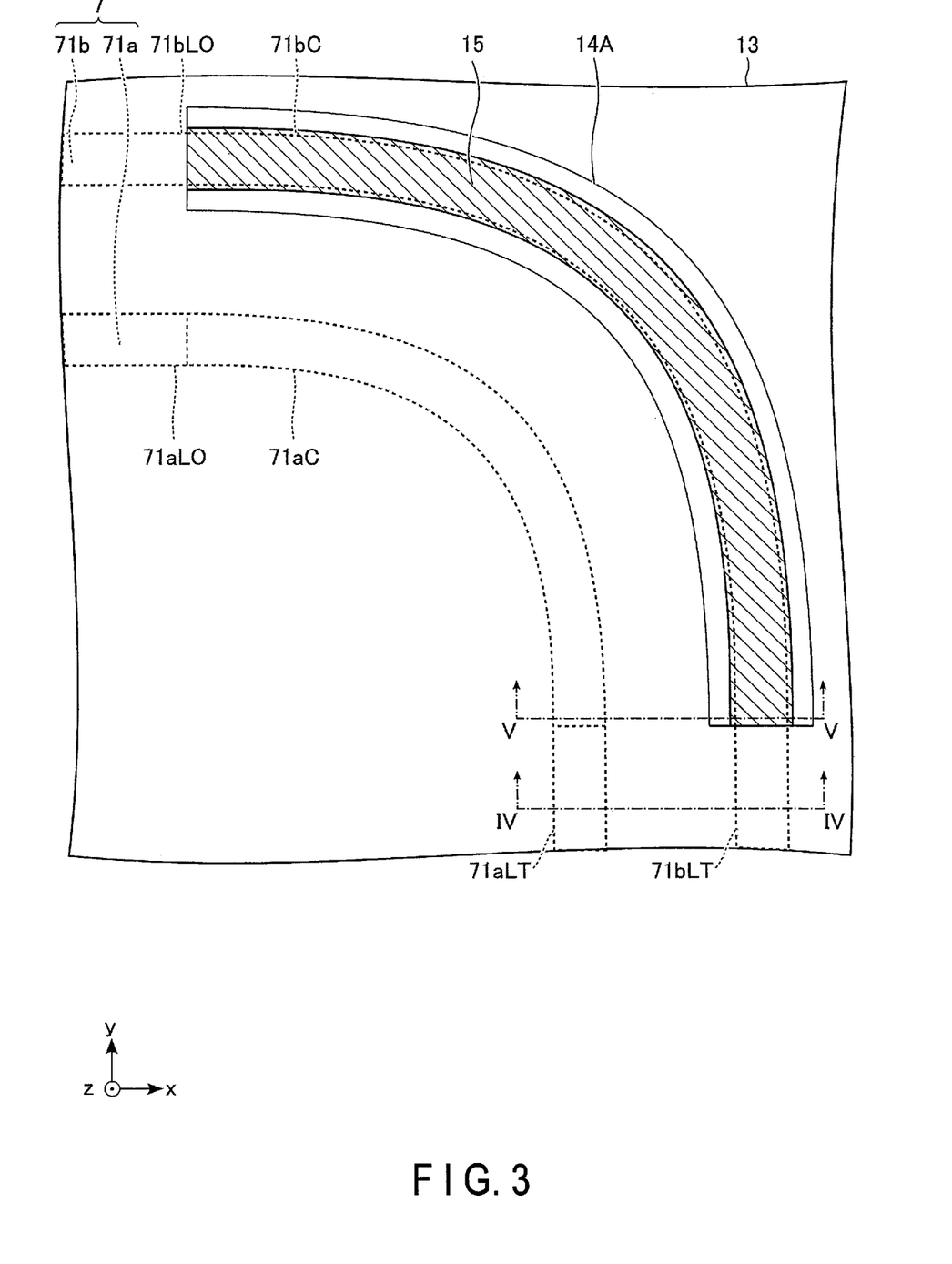
FIG. 3 is a plan view showing another part of the example of the structure of the printed wiring board according to the first embodiment.

FIGS. 2 and 3 are plan views each showing a part of an example of a structure of the printed wiring board according to the first embodiment. FIGS. 2 and 3 are xy plan views of the electronic device 1 as viewed in the +z direction. FIGS. 2 and 3 each show an enlarged view of a part of a portion on which the devices 2 and 3 are not arranged, of the upper surface of the printed wiring board 5, and they show the same region. FIGS. 2 and 3 show layers of different coordinates on the z-axis. FIG. 3 shows a layer on the +z direction side of a layer shown in FIG. 2. Some of the cross-sectional structures of the region shown in FIGS. 2 and 3 are described later with reference to FIGS. 4 and 5. The hatching in FIG. 2 is given only for the purpose of promoting visual understanding; thus, the hatched components are irrelevant to materials indicated by a pattern of the hatching. As shown in FIGS. 2 and 3, the printed wiring board 5 includes the conductor group 7, an insulator 13, and a plating 15. The conductor group 7 includes conductors 71a and 71b.

The conductors 71a and 71b are conductive members. The conductors 71a and 71b function as wiring. Each of the conductors 71a and 71b is positioned on the xy plane of a layer at a coordinate on the z-axis. The conductors 71a and 71b are made of, for example, metal including copper (Cu) or copper itself. The conductors 71a and 71b transmit two single-ended signals that are substantially the same and have different phases, respectively. In other words, the conductors 71a and 71b are used for differential signal transmission. In the differential signal transmission, one of the single-ended signals transmits a signal to be transmitted, and the other of the single-ended signals transmits a signal having a phase different from that of the signal to be transmitted, ideally a signal having a phase of 180 degrees. In other words, in the differential signal transmission, one of the single-ended signals and the other of the single-ended signals transmit signals having inverse phases with respect to each other. A signal receiver uses a difference between voltages of the two single-ended signals (differential signal) as a received signal. The expression "substantially the same" as used herein refers to being intended to be the same, but not completely identical, allowing for errors due to limitations in manufacturing technology and/or measuring technology.

As shown in FIG. 2, the conductors 71a and 71b respectively have a linear shape with a width. Hereinafter, a "width" of a component refers to a dimension along a direction orthogonal to a direction in which the component extends, among various dimensions of the component. A "width" of a curved component refers to a dimension along a direction of a curvature radius of the component among various dimensions of the component. Also, a "width" of a component may be, for example, an average of widths at various points of the component.

The conductors 71a and 71b extend along the xy plane while maintaining substantially the same distance. The distance between the conductors 71a and 71b is, for example, a distance between the center of the conductor 71a in the width direction thereof and the center of the conductor 71b in the width direction thereof.

The conductor group 7 includes a first linear part 7LO, a second linear part 7LT, and a direction-changing part 7C. The direction-changing part 7C is positioned between the first linear part 7LO and the second linear part 7LT, and connects the first linear part 7LO and the second linear part 7LT. The direction-changing part 7C corresponds to the part 7C shown in FIG. 1 where the direction in which the conductor group 7 extends changes.

In the first linear part 7LO, the conductors 71a and 71b extend in a first direction and are parallel to each other. FIG. 2 and the descriptions below are based on an example in which the first direction conforms to the x-axis. Hereinafter, a part included in the first linear part 7LO among the conductor 71a may be referred to as a "first linear part 71aLO of the conductor 71a", or simply as a "first linear part 71aLO". A part included in the first linear part 7LO among the conductor 71b may be referred to as a "first linear part 71bLO of the conductor 71b", or simply as a "first linear part 71bLO". In the example shown in FIG. 2, the first linear part 71bLO of the conductor 71b is positioned on the lower side (−y direction side) of the first linear part 71aLO of the conductor 71a.

In the second linear part 7LT, the conductors 71a and 71b extend in a second direction different from the first direction, and are parallel to each other. FIG. 2 and the descriptions below are based on an example in which the second direction conforms to the y-axis. Hereinafter, a part included in the second linear part 7LT among the conductor 71a may be referred to as a "second linear part 71aLT of the conductor 71a", or simply as a "second linear part 71aLT". A part included in the second linear part 7LT among the conductor 71b may be referred to as a "second linear part 71bLT of the conductor 71b", or simply as a "second linear part 71bLT". In the example shown in FIG. 2, the second linear part 71bLT of the conductor 71b is positioned on the right side (+x direction side) of the second linear part 71aLT of the conductor 71a.

In the direction-changing part 7C, the conductors 71a and 71b have a shape that connects the first linear part 7LO and the second linear part 7LT. For example, the conductors 71a and 71b are curved in the direction-changing part 7C. Namely, both the conductors 71a and 71b have an arc shape with a width in the direction-changing part 7C. FIG. 2 and the descriptions below are based on an example in which the conductors 71a and 71b included in the direction-changing part 7C are curved. Hereinafter, a part of the conductor 71a included in the direction-changing part 7C may be referred to as a "direction-changing part 71aC of the conductor 71a", or simply as a "direction-changing part 71aC". A part of the conductor 71b included in the direction-changing part 7C may be referred to as a "direction-changing part 71bC of the conductor 71b", or simply as a "direction-changing part 71bC". The direction-changing part 71aC of the conductor 71a and the direction-changing part 71bC of the conductor 71b constitute a part of an outer circle and a part of an inner circle of two concentric circles having different diameters, respectively.

The direction-changing part 71aC of the conductor 71a is connected to an end of the first linear part 71aLC of the conductor 71a and an end of the second linear part 71aLT of the conductor 71a. The direction-changing part 71bC of the conductor 71b is connected to an end of the first linear part 71bLO of the conductor 71b and an end of the second linear part 71bLT of the conductor 71b.

The direction-changing part 7C can be defined as a part of the conductor group 7 where a length of the direction-changing part 71aC of the conductor 71a differs from a length of the direction-changing part 71bC of the conductor 71b. Namely, in the example shown in FIG. 2, the first linear part 71aLO of the conductor 71a is parallel to the first linear part 71bLO of the conductor 71b. Therefore, the length of the first linear part 71aLO of the conductor 71a is substantially the same as the length of the first linear part 71bLO of the conductor 71b. Also, the second linear part 71aLT of the conductor 71a is parallel to the second linear part 71bLT of the conductor 71b. Therefore, a length of the second linear part 71aLT of the conductor 71a is substantially the same as a length of the second linear part 71bLT of the conductor 71b. On the other hand, since the direction in which the first linear part 7LO of the conductor group 7 extends differs from the direction in which the second linear part 7LT of the conductor group 7 extends, a distance between the end of the first linear part 71aLO of the conductor 71a and the end of the second linear part 71aLT of the conductor 71a differs from a distance between the end of the first linear part 71bLO of the conductor 71b and the end of the second linear part 71bLT of the conductor 71b. Based on this configuration and the configuration in which the conductor 71a and the conductor 71b extend along paths maintaining substantially the same distance, as described above, the length of the direction-changing part 71bC of the conductor 71b is longer or larger than the length of the direction-changing part 71aC of the conductor 71a. Therefore, a part connecting the end of the first linear part 71aLO and the end of the second linear part 71aLT of the conductor 71a, and a part connecting the end of the first linear part 71bLO and the end of the second linear part 71bLT of the conductor 71b correspond to the direction-changing part 7C.

As shown in FIG. 3 and as described above, the insulator 13 is arranged on the upper side along the z-axis (+z direction side) of the layer provided with the conductors 71a and 71b. The insulator 13 is an insulating member. The insulator 13 covers the upper surface of the printed wiring board 5. The insulator 13 is, for example, a solder resist. The insulator 13 is positioned in the uppermost layer of the printed wiring board 5 and constitutes a part of the upper surface of the printed wiring board 5. The insulator 13 extends along the xy plane. The insulator 13 covers the conductor 71a entirely, and covers the conductor 71b partially. Namely, the insulator 13 is partially opened. An opening 14A of the insulator 13 extends in a direction along the z-axis, and reaches a position on the lower side of an upper surface of the conductor 71b (−z direction side) from an upper surface of the insulator 13 on the z-axis. The opening 14A of the insulator 13 reaches, for example, the same position as a lower surface of the conductor 71b from the upper surface of the insulator 13 on the z-axis.

The opening 14A of the insulator 13 partially overlaps with the direction-changing part 71bC of the conductor 71b in the xy planar view. For example, the opening 14A entirely overlaps with the direction-changing part 71bC of the conductor 71b in the xy planar view. Namely, the opening 14A has an arc shape with a width, and the opening 14A and the direction-changing part 71bC of the conductor 71b are positioned on concentric circles. In addition, the opening 14A has a width larger than the width of the direction-changing part 71bC of the conductor 71b in the xy planar view. FIG. 3 shows such an example. To give a more specific example, an inner periphery of the opening 14A is positioned on an inner side of an inner periphery of the direction-changing part 71bC of the conductor 71b, and/or an outer periphery of the opening 14A is positioned on an outer side of an outer periphery of the direction-changing part 71bC of the conductor 71b. An "inner side" refers to a side close to a center of the two concentric circles, and an "outer side" refers to a side far from the center of the two concentric circles.

The plating 15 is a metal layer. The plating 15 covers a surface of a part that overlaps with the opening 14A, of the direction-changing part 71bC of the conductor 71b in the xy planar view. The plating 15 includes, for example, gold (Au) or nickel (Ni). The plating 15 may be an electrolytic plating or an electroless plating.

Figure 4:
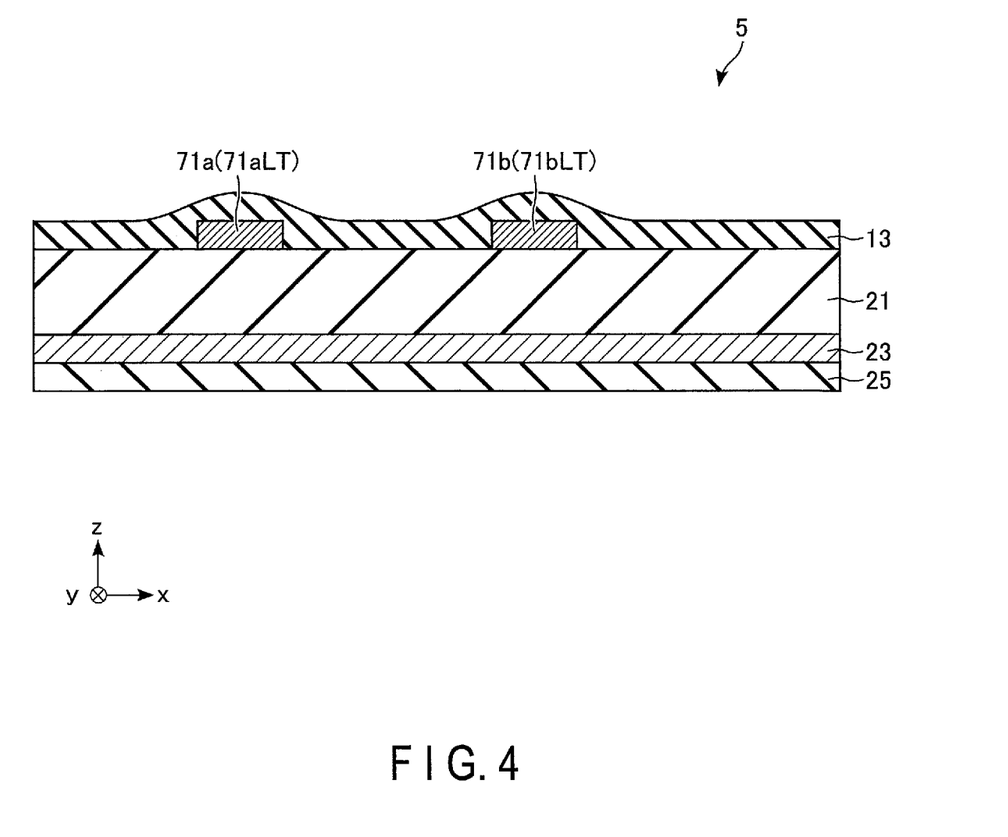
FIG. 4 is a cross-sectional view showing an example of a cross-sectional structure of the printed wiring board according to the first embodiment.

FIG. 4 shows an example of a cross-sectional structure of the printed wiring board 5 according to the first embodiment. FIG. 4 shows a cross section taken along the line IV-IV in FIGS. 2 and 3, that is, shows cross sections of the second linear part 7LT of the conductor group 7 and a region therebelow.

As shown in FIG. 4, the printed wiring board 5 includes an insulator 21, a conductor 23, an insulator 25, the insulator 13, the conductor 71a, and the conductor 71b. The printed wiring board 5 has a microstrip line structure.

The insulator 21 is an insulating member. The insulator 21 functions as a substrate or a base of the printed wiring board 5. The insulator 21 extends along the xy plane. The insulator 21 insulates a conductor (wiring) on an upper side of the insulator 21 from a conductor (wiring) on a lower side of the insulator 21.

The conductor 23 is a conductive member. The conductor 23 functions as wiring. The conductor 23 is in contact, at its upper surface (surface on the +z direction side), with a lower surface (surface on the −z direction side) of the insulator 21, and extends along the xy plane. The conductor 23 is coupled to the device 2 and the device 3, for example, through a via (not shown). A ground potential is applied to the conductor 23 when operating the electronic device 1. Based on this, the conductor 23 may also be referred to as a ground layer. The ground potential is a reference potential for the device 2 and the device 3 to operate. The ground potential is also a reference potential of a power source supplied to the device 2 and the device 3.

The insulator 25 is an insulating member. The insulator 25 covers a lower surface of the printed wiring board 5 (surface of the printed wiring board 5 as viewed in the −z direction). The insulator 25 is, for example, a solder resist. The insulator 25 is positioned in the lowermost layer of the printed wiring board 5 and constitutes a part of the lower surface of the printed wiring board 5. The insulator 25 extends along the xy plane. The insulator 25 insulates the conductor 23 from the outside of the printed wiring board 5.

The conductor 71a (the second linear part 71aLT of the conductor 71a) and the conductor 71b (the second linear part 71bLT of the conductor 71b) are arranged on the upper surface (surface on the +z direction side) of the insulator 21.

The insulator 13 covers the upper surface of the insulator 21, the entire surface of the second linear part 71aLT of the conductor 71a, and the entire surface of the second linear part 71bLT of the conductor 71b. The conductor 71a and the conductor 71b are coupled to the device 2 and the device 3, for example, through coupling members (not shown), or solder as an example. The insulator 13 insulates the conductor 71a and the conductor 71b from the outside of the printed wiring board 5.

Cross sections of the first linear part 7LO of the conductor group 7 and a region therebelow are the same as those shown in FIG. 4. Specifically, the descriptions of FIG. 4 where the "second linear part 71aLT" and the "second linear part 71bLT" are replaced by the "first linear part 71aLO" and the "first linear part 71bLO" apply to the cross sections of the first linear part 7LO of the conductor group 7 and the region therebelow.

Figure 5:
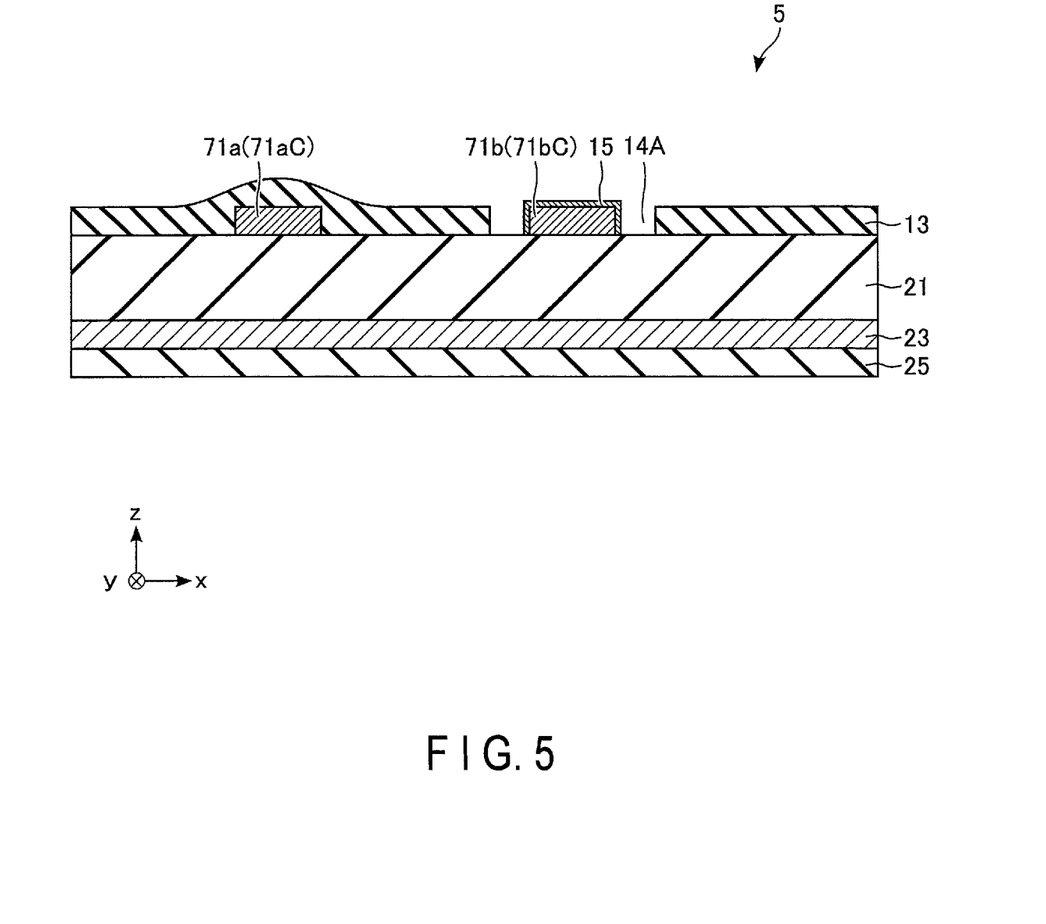
FIG. 5 is a cross-sectional view showing an example of another cross-sectional structure of the printed wiring board according to the first embodiment.

FIG. 5 shows an example of a cross-sectional structure of the printed wiring board 5 according to the first embodiment. FIG. 5 shows a cross section taken along the line V-V in FIGS. 2 and 3, that is, shows cross sections of the direction-changing part 7C of the conductor group 7 and a region therebelow. The structure shown in FIG. 5 is similar to the structure shown in FIG. 4. Different points will be described below.

As shown in FIG. 5 and as described above with reference to FIG. 3, the insulator 13 is partially opened in the region where the direction-changing part 7C of the conductor group 7 is located. For example, the insulator 13 is opened around the direction-changing part 71bC of the conductor 71b. The opening 14A reaches the upper surface of the insulator 25 from the upper surface of the insulator 13 on the z-axis. Therefore, the direction-changing part 71bC of the conductor 71b whose surface is covered with the plating 15 is exposed in the region where the direction-changing part 7C of the conductor group 7 is located.

1.2. Advantages (Advantageous Effects)

According to the first embodiment, a printed wiring board which allows for transmission of a signal with little degradation in its characteristics can be provided, as will be described below.

In the differential signal transmission, when two single-ended signals have inverse phases with respect to each other, that is, when two single-ended signals have a phase difference of 180 degrees, the differential signal has the largest amplitude. Therefore, it is desirable that two single-ended signals reach a receiver while having inverse phases with respect to each other. Two single-ended signals may be transmitted through a microstripline. A microstripline transmits a signal via electromagnetic waves. Arranging two conductors on an upper surface of a substrate and transmitting two single-ended signals through the two conductors results in transmission of a differential signal through the microstripline.

The two conductors extend along a surface parallel to a surface along which the substrate extends, while maintaining a certain distance from each other. The two conductors have the same length in their linear parts. Since the two conductors have the same length in their linear parts, no phase difference between the single-ended signals that travel through the two conductors is generated in the linear parts. On the other hand, there is a case where the two conductors include a part curved on the substrate. In this case, the two conductors have different lengths in their curved parts. Namely, the outer conductor is longer than the inner conductor. The time required for a single-ended signal to pass through the conductor on the outer side of the curved parts is longer than the time required for a single-ended signal to pass through the conductor on the inner side of the curved parts. Because of this, a phase difference between the two single-ended signals may differ between an entrance and an exit of the curved parts. Accordingly, even if the two single-ended signals have a phase difference of 180 degrees at the entrance of the curved parts, the two single-ended signals may have a phase difference of other than 180 degrees at the exit of the curved parts. A differential signal by the two single-ended signals that greatly deviates from a phase difference of 180 degrees has an amplitude smaller than an amplitude of a differential signal by the two single-ended signals that have a phase difference of 180 degrees, or has a waveform distortion generated near the zero cross point of the differential signal. This means that characteristics of the differential signal have degraded.

A printed wiring board 100 for reference and comparison will be described. The printed wiring board 100 includes an insulator 103 in place of the insulator 13 of the printed wiring board 5 of the first embodiment, and has the same structure and configuration as those of the printed wiring board 5 in other points. The insulator 103 is, for example, a solder resist, does not have such an opening as the opening 14A of the insulator 13, and covers the conductors 71a and 71b. Therefore, a relative permittivity around the conductors 71a and 71b is the same over all of the parts of the conductors 71a and 71b. A speed of electromagnetic waves is affected by a relative permittivity of a medium around the electromagnetic waves. Since relative permittivities of the medium around the conductors 71a and 71b are the same, the conductors 71a and 71b transmit electromagnetic waves at substantially the same speed in the curved parts as well. Therefore, the time required for the electromagnetic waves to pass through each of the curved parts of the conductors 71a and 71b depends on lengths of the curved parts of the conductors 71a and 71b. Since the curved part of the conductor 71b is longer than the curved part of the conductor 71a, the time required for the electromagnetic waves to pass through the curved part of the conductor 71b is longer than the time required for the electromagnetic waves to pass through the curved part of the conductor 71a. Therefore, a phase difference between the two single-ended signals that travel through the conductors 71a and 71b at the entrance of the curved parts may be different from a phase difference at the exit of the curved parts.

According to the first embodiment, whereas the conductor 71a on the inner side is covered with the insulator 13 in the direction-changing part 7C of the conductor group 7, a part of the conductor 71b on the outer side is not covered with the insulator 13 in the direction-changing part 7C of the conductor group 7. The larger the relative permittivity of a medium, the slower speed of the electromagnetic waves in the medium. A surface of a printed wiring board is generally covered with an insulator such as a solder resist in order to protect wiring. The printed wiring board 5 of the first embodiment also includes the insulator 13. The insulator 13 has a relative permittivity of approximately 3 to 5 when it is a solder resist. The direction-changing part 71*a*C of the conductor 71*a* is covered with the insulator 13 in the same manner as another part of the conductor 71*a*. Therefore, speed of the electromagnetic waves traveling through the direction-changing part 71*a*C of the conductor 71*a* depends at least partially on the relative permittivity of the insulator 13. For example, when a relative permittivity is high, speed of the electromagnetic waves is low. On the other hand, since a part of the direction-changing part 71*b*C of the conductor 71*b* is not covered with the insulator 13, a relative permittivity at this uncovered part is a relative permittivity of the air (approximately 1). Therefore, an effective relative permittivity of the direction-changing part 71*b*C of the conductor 71*b* (an overall effective electric permittivity of a plurality of media having different relative permittivities) is lower than the relative permittivity of the solder resist. For this reason, the speed of the electromagnetic waves traveling through the part of the direction-changing part 71*b*C of the conductor 71*b* not covered with the insulator 13 is faster than speed of the electromagnetic waves traveling through the direction-changing part 71*a*C of the conductor 71*a*. Thus, it is compensated that the electromagnetic waves require a longer time to pass through the direction-changing part 71*a*C of the conductor 71*a* than time required for the electromagnetic waves to pass through the direction-changing part 71*b*C of the conductor 71*b* due to the direction-changing part 71*b*C of the conductor 71*b* being longer than the direction-changing part 71*a*C of the conductor 71*a*. Namely, the difference between the time required for the electromagnetic waves to pass through the direction-changing part 71*a*C of the conductor 71*a* and the time required for the electromagnetic waves to pass through the direction-changing part 71*b*C of the conductor 71*b* is smaller than the difference between them in the referential printed wiring board 100. As such, the gap between the phases, at the exit of the direction-changing part 7C, of the two single-ended signals having passed through the direction-changing part 7C is smaller than that in the referential printed wiring board 100. Accordingly, the printed wiring board 5 with degradation of the characteristics of the differential signal suppressed can be provided.

The higher a frequency of the single-ended signals transmitted by conductors, the larger a gap between phases of the two single-ended signals in curved parts of the conductors. In the first embodiment, the gap between the phases of the two single-ended signals in the curved parts is suppressed regardless of frequency band. Thus, the first embodiment can suppress the phase gap even in a case of transmitting high-frequency signals.

Also, according to the first embodiment, the part of the direction-changing part 71*b*C of the conductor 71*b* where the opening 14A is positioned is provided with the plating 15 on its surface. The insulator 13 causes transmission loss of a signal in the conductors 71*a* and 71*b*. The transmission loss is based at least partially on a material of a surface of conductors (wiring). According to the first embodiment, an imbalance between the transmission loss in the part of the direction-changing part 71*a*C of the conductor 71*a* and the transmission loss in the part of the direction-changing part 71*b*C of the conductor 71*b* due to the opening 14A can be adjusted and alleviated by the plating 15.

1.3. Modifications

As described with reference to FIG. 3, it suffices that the opening 14A partially overlaps with the direction-changing part 71*b*C of the conductor 71*b* in the xy planar view, and the opening 14A need not overlap entirely with the direction-changing part 71*b*C of the conductor 71*b* in the xy planar view. For example, the opening 14A may overlap only with a portion of a total width of the direction-changing part 71*b*C of the conductor 71*b* in the xy planar view. For example, the opening 14A covers only a part on an outer side of the width of the direction-changing part 71*b*C of the conductor 71*b*.

Alternatively, the opening 14A may overlap with only a part of the direction-changing part 71*b*C of the conductor 71*b* between the boundary with the first linear part 71*a*LO and the boundary with the second linear part 71*a*LT, in the xy planar view. For example, the opening 14A overlaps with only a part of the direction-changing part 71*b*C of the conductor 71*b*, that includes the boundary with the first linear part 71*a*LO, in the xy planar view.

Alternatively, the opening 14A may include two separate sub-openings that interpose therebetween a part of the direction-changing part 71*b*C of the conductor 71*b*, that does not have the opening 14A in the region between the boundary with the first linear part 71*a*LO and the boundary with the second linear part 71*a*LT, in the xy planar view. In these modifications, the part of the direction-changing part 71*b*C of the conductor 71*b*, that does not overlap with the opening 14A is not covered by the plating 15.

Figure 6:
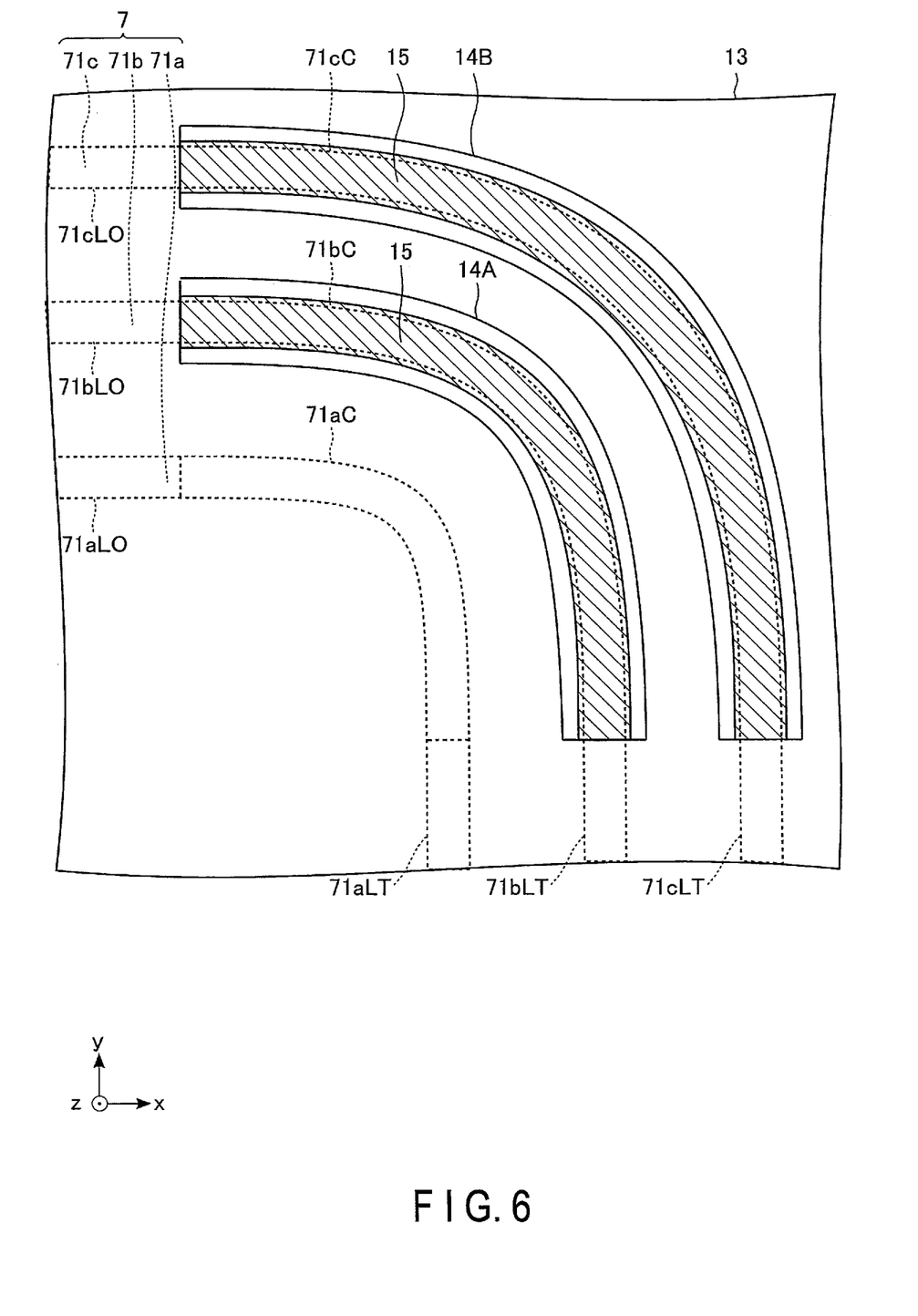
FIG. 6 is a plan view showing a part of an example of a structure of a printed wiring board according to a modification of the first embodiment.

The descriptions provided so far are based on an example in which the conductor group 7 transmits signals of two phases. The conductor group 7 may transmit signals of three or more phases. In this case, the conductor group 7 includes an equal number of conductors 71 to the number of phases of the transmitted signals. FIG. 6 shows an example in which the conductor group 7 transmits signals of three phases, that is, an example in which the conductor group 7 includes the conductors 71*a* and 71*b* and a conductor 71*c*. The conductor 71*c* is positioned opposite to the conductor 71*a* (an outer side) with respect to the conductor 71*b*. The conductors 71*b* and 71*c* extend along the xy plane while maintaining substantially the same distance, in the same manner as the conductors 71*a* and 71*b* extending along the xy plane while maintaining substantially the same distance as described with reference to FIG. 2. A part of the conductor 71*c* included in the first linear part 7LO, the second linear part 7LT, and the direction-changing part 7C of the conductor group 7 may be referred to as a "first linear part 71*c*LO", a "second linear part 71*c*LT", and a "direction-changing part 71*c*C", respectively, of the conductor 71*c*.

The insulator 13 has an opening in another part in addition to the opening 14A. An additional opening 14B of the insulator 13 partially overlaps with the direction-changing part 71*c*C of the conductor 71*c* in the xy planar view. For example, the opening 14B may overlap entirely with the direction-changing part 71*c*C of the conductor 71*c* in the xy planar view. Namely, the opening 14B has an arc shape with a width, and the opening 14B and the direction-changing part 71*c*C of the conductor 71*c* is positioned on concentric circles. In addition, the opening 14B has a width larger than a width of the direction-changing part 71*c*C of the conductor 71*c* in the xy planar view, in the same manner as the opening 14A having a width larger than the width of the direction-changing part 71*b*C of the conductor 71*b* in the xy planar view. FIG. 6 shows such an example.

Figure 7:
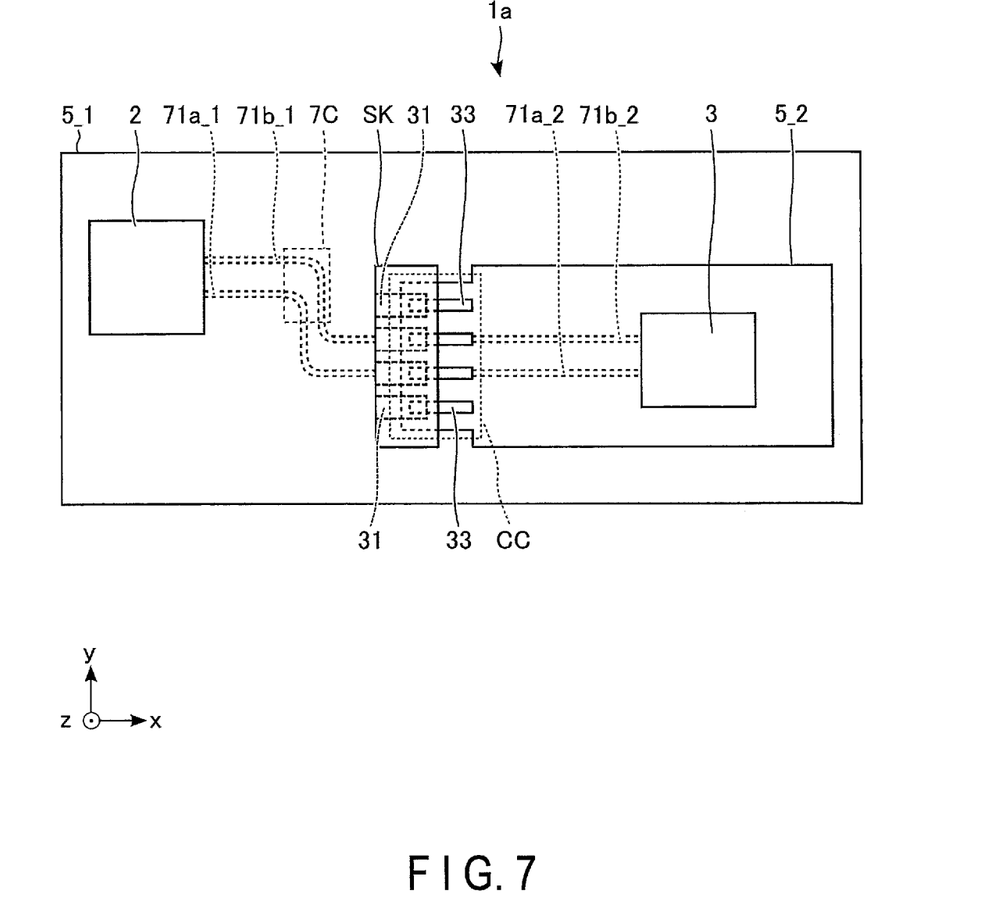
FIG. 7 is a plan view showing an example of a structure of an electronic device according to a modification of the first embodiment.

FIG. 7 is a plan view showing an example of a structure of an electronic device according to a modification of the first embodiment. As shown in FIG. 7, an electronic device 1*a* according to the modification includes the device 2, the device 3, printed wiring boards 5_1 and 5_2, and a socket SK. The printed wiring board 5_1 includes conductors 71a1 and 71b_1. The printed wiring board 5_2 includes a connector part CC, and conductors 71a_2 and 71b_2.

The device 2 and the socket SK are arranged on the printed wiring board 5_1. The socket SK includes a plurality of terminals 31. Some of the terminals 31 are electrically coupled to the device 2 via the conductors 71a_1 and 71b_1. A set of the conductors 71a_1 and 71b_1 functions as wiring that transmits a differential signal.

The device 3 is arranged on the printed wiring board 52. The connector part CC includes a plurality of terminals 33. The plurality of terminals 33 are formed of wiring arranged on the printed wiring board 5_2. Namely, the connector part CC is configured as an edge connector. The connector part CC is configured to allow, when inserted into the socket SK, each terminal 33 come into contact with a terminal 31 in the socket SK. Some of the terminals 33 are electrically coupled to the device 3 via the conductors 71a_2 and 71b_2. The set of the conductors 71a_2 and 71b_2 functions as wiring that transmits a differential signal. FIG. 7 shows the state in which the connector part CC has been inserted into the socket SK.

The device 2 and the device 3 are connected to or electrically coupled to each other via the conductors 71a_1 and 71b_1, the terminals 31 of the socket SK, the terminals 33 of the connector part CC, and the conductors 71a_2 and 71b_2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A printed wiring board comprising:
   a substrate having an insulative property, extending along a first plane, and including a first surface extending along the first plane;
   a first conductor on the first surface of the substrate and extending along the first surface;
   a second conductor on the first surface of the substrate and extending at a distance from the first conductor along the first surface; and
   a first insulator covering a part of the first surface of the substrate, wherein
   the first conductor includes: a first part having a linear shape and extending in a first direction parallel to the first plane; a second part extending in a second direction which is parallel to the first plane and intersects with the first direction; and a third part including a first end and a second end, the first end being connected to the first part, and the second end being connected to the second part;
   the second conductor includes: a fourth part having a linear shape and extending in the first direction; a fifth part having a linear shape and extending in the second direction; and a sixth part including a third end and a fourth end, the third end being connected to the fourth part and the fourth end being connected to the fifth part; and
   the first insulator further covers the first part, the second part, and the third part of the first conductor, and the fourth part and the fifth part of the second conductor, and is opened in a part of a first region extending along the sixth part of the second conductor, the first region being positioned above the sixth part of the second conductor in a third direction intersecting with the first direction and the second direction.

2. The printed wiring board according to claim 1, wherein the sixth part of the second conductor is positioned on a side further in the first direction than the third part of the first conductor.

3. The printed wiring board according to claim 1, wherein the sixth part of the second conductor and the third part of the first conductor are curved along the first plane.

4. The printed wiring board according to claim 1, wherein the first insulator is opened in an entire area of the first region.

5. The printed wiring board according to claim 1, wherein the first insulator is opened in the first region, from a surface of the first insulator on a side in the third direction to an area below a surface of the sixth part of the second conductor on a side in the third direction.

6. The printed wiring board according to claim 1, further comprising a plating on a surface of the sixth part of the second conductor.

7. The printed wiring board according to claim 6, wherein the plating includes nickel or gold.

8. The printed wiring board according to claim 2, wherein the sixth part of the second conductor and the third part of the first conductor are curved along the first plane.

9. The printed wiring board according to claim 3, wherein the first insulator is opened in an entire area of the first region.

10. The printed wiring board according to claim 3, further comprising a plating on a surface of the sixth part of the second conductor.

11. An electronic device, comprising:
    the printed wiring board according to claim 1; and
    a first device on the printed wiring board, the first device being electrically coupled to the first conductor and the second conductor.

12. The electronic device according to claim 11, further comprising a second device on the printed wiring board, the second device being electrically coupled to the first conductor and the second conductor.

13. The electronic device according to claim 11, wherein the sixth part of the second conductor is positioned on a side further in the first direction than the third part of the first conductor.

14. The electronic device according to claim 11, wherein the sixth part of the second conductor and the third part of the first conductor are curved along the first plane.

15. The electronic device according to claim 11, wherein the first insulator is opened in an entire area of the first region.

16. The electronic device according to claim 11, wherein the first insulator is opened in the first region, from a surface of the first insulator on a side in the third direction to an area below a surface of the sixth part of the second conductor on a side in the third direction.

17. The electronic device according to claim 11, further comprising a plating on a surface of the sixth part of the second conductor.

18. The electronic device according to claim 17, wherein the plating includes nickel or gold.

19. The electronic device according to claim 13, wherein the sixth part of the second conductor and the third part of the first conductor are curved along the first plane.

20. The electronic device according to claim 14, wherein the first insulator is opened in an entire area of the first region.

* * * * *